United States Patent [19]

Scott et al.

[11] Patent Number: 5,016,012

[45] Date of Patent: May 14, 1991

[54] TECHNIQUE FOR COMPENSATING SWITCHED CAPACITOR CIRCUITS HAVING GAIN-SETTING RESISTORS

[75] Inventors: Jeffrey W. Scott, Temple; Thayamkulangara R. Viswanathan, Wyomissing, both of Pa.

[73] Assignee: AT&T Bell Laboratories, Murray Hill, N.J.

[21] Appl. No.: 416,888

[22] Filed: Oct. 4, 1989

[51] Int. Cl.[5] .............................................. H03M 1/06
[52] U.S. Cl. ..................................... 341/118; 341/150
[58] Field of Search ............... 341/118, 120, 121, 144, 341/150, 153, 154, 172

[56] References Cited

U.S. PATENT DOCUMENTS

| | | | |
|---|---|---|---|
| 4,404,544 | 9/1983 | Dwarakanath | 341/150 X |
| 4,568,917 | 2/1986 | McKenzie et al. | 341/118 |
| 4,667,179 | 5/1987 | Law et al. | 341/150 |
| 4,837,572 | 6/1989 | Gulczynski | 341/150 |

Primary Examiner—A. D. Pellinen
Assistant Examiner—Brian K. Young
Attorney, Agent, or Firm—S. W. McLellan

[57] ABSTRACT

A technique for compensating for variations in a resistor set overall gain switched-capacitor circuits, such as high accuracy digital-to-analog converters. The variation in overall gain from the desired gain is due to the variation in the total capacitance of the capacitors, compared to the variation in the resistance of the resistor, in the circuit during manufacture. A bias circuit, with two reference voltage outputs, is adapted to have a capacitor and a fixed resistor vary one of the voltage references depending on the capacitance thereof. The voltage difference between the two voltage references varies the overall gain of the switched capacitor circuit to compensate for variations in the overall gain. Also, a switched-capacitor digital-to-analog converter utilizing the above technique is presented.

9 Claims, 2 Drawing Sheets 5,016,012

TECHNIQUE FOR COMPENSATING SWITCHED CAPACITOR CIRCUITS HAVING GAIN-SETTING RESISTORS

CROSS-REFERENCE TO RELATED APPLICATION

Background of the Invention

This application is related to a co-pending patent application titled "INTEGRAL SWITCHED CAPACITOR FIR FILTER/DIGITAL-TO-ANALOG CONVERTER FOR SIGMA-DELTA ENCODED DIGITAL AUDIO", by J. W. Scott, et al., Ser. No. 07/416,888, filed simultaneously with, and assigned to the same assignee as, this application.

1. Field of the Invention

This invention relates to switched capacitor circuit designs in general, and more particularly, to integrated circuit switched capacitor circuit designs using resistors as part thereof.

2. Description of the Prior Art

Switched capacitor circuits, such as a digital-to-analog converter (DAC) shown in U.S. Pat. No. 4,404,544, issued to M. R. Dwarakanath, and assigned to the same assignee as this invention, are usually implemented using an all-capacitors arrangement without using any resistors to control the characteristics thereof. Such designs are acceptable except in very low noise applications and/or where high accuracy and reproduceability is needed, such as low level digital audio (16 bits or greater) circuits. In these applications, resistors are used in the feedback paths of the various operational amplifiers in the circuit instead of switched capacitors. Typically, those resistors are external to the integrated circuit embodying the filter since integrated circuit resistors usually having insufficient linearity for many low distortion/low noise applications and be amendable to trimming.

A drawback of using resistors as part of any switched capacitor circuit is the large variation of the capacitors' capacitances from the desired values, in comparison with the relatively small variation of resistors' resistances. These variations can cause undesired changes in the characteristics of the resulting circuit, such as a change in the overall gain thereof. The large variation in the capacitances results primarily from the capacitors being, as a whole, proportionally larger or smaller than the design value due to processing variations during the fabrication of the embodying integrated circuit. However, the capacitances of the capacitors relative to each other is substantially constant, making all-capacitor designs relatively immune to total capacitance variations. Typically, the variations in the total capacitance (i.e., capacitance of all the capacitors combined) can be ±20%, whereas an external (not integrated) resistor can be specified as ±1% or better. Hence, the resistors are trimmed to match the capacitors' variations for each integrated circuit made.

As noted, the all-capacitor switched capacitor circuit designs are, generally, not as susceptible to the variation in total capacitance; yet such designs may not be able to meet very tight tolerances, low distortion, and low noise requirements in demanding applications, such as compact disc digital audio or digital audio tape reproduction. Hence, it is desirable to use resistors in place of certain capacitors in these demanding applications.

SUMMARY OF THE INVENTION

It is, therefore, one aspect of this invention to provide a switched capacitor circuit design technique that compensates for the variation in the capacitance of signal carrying capacitors, in comparison to the resistors, in the circuit.

It is another aspect of this invention to provide a technique that allows switched capacitor circuits to achieve low noise and accurate conversion gain control requirements over manufacturing variations for such demanding applications as digital audio.

These and other aspects of the invention are provided for generally in a switched capacitor circuit having: at least one signal carrying operational amplifier having a first resistor in the feedback path thereof and an input; a first voltage reference; and, at least one signal capacitor, one end thereof selectively coupling between a second voltage reference and the virtual ground input of the signal carrying operational amplifier, the other end thereof selectively coupling between the second voltage reference and the first voltage reference; the circuit being characterized by a second resistor and a switched capacitor; the voltage difference between the first and second voltage references being dependent on the resistance of the second resistor and the equivalent resistance of the switched capacitor. The switched capacitor varies the voltage difference to compensate for variation in capacitance of the signal capacitor.

It is another aspect of the invention to provide an improved switched capacitor digital-to-analog converter compensated for variations in the capacitance of the signal carrying capacitors, in comparison to the resistors used in the circuit. This is obtained generally in a digital-to-analog converter, responsive to a digital input signal, having: a summing node; at least one signal carrying operational amplifier having a first resistor in the feedback path thereof and coupling to the summing node; a first voltage reference; and, at least one signal capacitor, a first end thereof selectively coupling between a second voltage reference and the summing node, the second end thereof selectively coupling between the second voltage reference and the first voltage reference in response to the digital input signal; the improved converter being characterized by a second resistor and a switched capacitor; the first voltage reference being dependent on the second voltage reference, the resistance of the second resistor and the equivalent resistance of the switched capacitor. The second end of the signal capacitor is alternately coupling between the second voltage reference and the summing node in response to a clock signal having a frequency of $f_c$, and wherein the first end of the signal capacitor is selectively coupling between the second voltage reference and the first voltage reference in response to the clock signal in combination with the digital input signal.

The above aspects are also provided generally by a method of compensating for variations in circuit characteristics of a switched capacitor circuit formed in an integrated circuit, the circuit having: at least one signal carrying operational amplifier having a first resistor in the feedback path thereof and an input; a first voltage reference; and, at least one signal capacitor, one end thereof selectively coupling between a second voltage reference and the input of the signal carrying operational amplifier, the other end thereof selectively coupling between the second voltage reference and the first voltage reference; the method being characterized by the step of: varying the voltage difference between the first and second voltage references in response to the resistance of a second resistor and the equivalent resistance of a switched capacitor to compensate for variations in the capacitance of the signal capacitor.

BRIEF DESCRIPTION OF THE DRAWING

The foregoing features of this invention, as well as the invention itself, may be more fully understood from the following detailed description of the drawings, in which.

DETAILED DESCRIPTION

Figure 1:
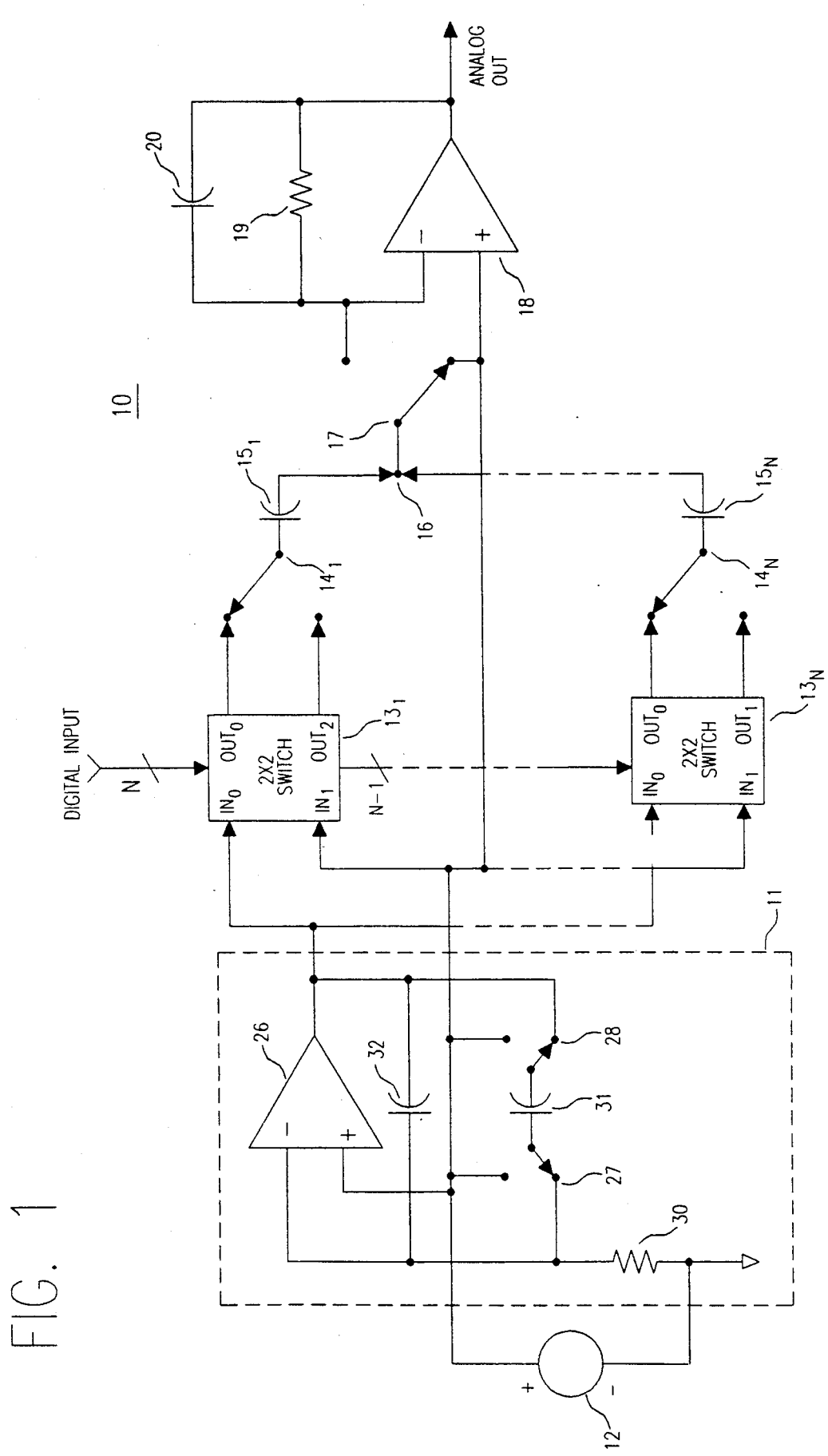
FIG. 1 is a schematic of an exemplary digital-to-analog converter.

In FIG. 1, an exemplary N-bit digital-to-analog converter (DAC) 10 is shown implemented using switched capacitor technology. As is well known in switched capacitor technology, non-overlapping clock signals (not shown) controls the switches $14_1$-$14_N$, 17, 27 and 28, the frequency of the clock signals being $f_c$. Also well known, and will not be discussed in detail here, switched capacitors synthesize resistors, the amount of equivalent "resistance" being dependent on the switching frequency and the capacitance (C) of the capacitor. For purposes here, that amount of "resistance" is approximately $1/f_c C$.

DAC 10 of FIG. 1 comprises 2×2 switches $13_1$-$13_N$, 2:1 switches $14_1$-$14_N$, switched signal capacitors $15_1$-$15_N$, a summing node 16, and a 1:2 switch 17. The combination of 2×2 switches $13_1$-$13_N$ and 2:1 switches $14_1$-$14_N$ selectively switch capacitors $15_1$-$15_N$ between two voltage references 11, 12. The first and second voltage references 11, 12, respectively, provide the necessary voltages for the proper operation of the DAC 10. As will be explained below, the voltage difference between the two references determines the analog output signal amplitude of the DAC 10, hence the overall gain of the DAC 10. Signal operational amplifier 18, coupling to the summing node 16 via switch 17 has a resistor 19 disposed in its feedback path. The first voltage reference 11 has its output voltage dependent on the second reference voltage 12, the resistance of a second resistor 30 and the equivalent resistance of a switched capacitor 31. Capacitor 31 compensates for variations in the total capacitance of signal capacitors $15_1$-$15_N$ in comparison with the variation (or the substantial lack of variation) in the resistance of the resistor 19, by varying the difference between the first and second reference voltages, 11, 12.

A more detailed explanation of FIG. 1 follows. The N-bit DAC 10 has a first voltage reference 11 and a second voltage reference 12 which drive N (N≧1) 2×2 switches $13_1$-$13_N$. The voltage reference 12, a conventional fixed voltage source, supplies a fixed bias voltage while having substantially zero impedance for AC signals. The reference 12, for example a bandgap derived voltage reference, provides the necessary bias voltage to the amplifier 18, typically near half the voltage difference between power supply voltages (not shown), such as two volts for a five volt power supply, the other voltage being substantially zero. Voltage reference 11 is dependent on the voltage from reference 12, as will be explained below. The switches $13_1$-$13_N$, which will also be explained in more detail below, serve to store the incoming digital input data and either pass through signals from $In_0$ to $Out_0$ and $In_1$ to $Out_1$, or $In_0$ to $Out_1$ and $In_1$ to $Out_0$, depending on the digital data stored within the switch $13_1$-$13_N$. Each switch $13_1$-$13_N$ uses one bit from the digital input data and may be loaded in parallel or shifted through serially.

The outputs from the switches $13_1$-$13_N$ connect to corresponding 2:1 switches $14_1$-$14_N$ which, in turn connects to one end of signal capacitors $15_1$-$15_N$. The capacitance of signal capacitors $15_1$-$15_N$—which is sometimes referred to as "size" due to the capacitance of integrated circuit capacitors being primarily determined by the area of the electrodes (plates) thereof—determines the "weight" given the corresponding bit in the digital input data, as will be explained in more detail below. The other end of the signal capacitors $15_1$-$15_N$ connect to summing node 16. A 1:2 switch 17 connects the summing node (and, therefore, all of the signal capacitors $15_1$-$15_N$) to the second voltage reference 12 or to a low-pass filter, comprised of signal operational amplifier 18, resistor 19 and capacitor 20. As discussed above, the switches $14_1$-$14_N$ and 17 are controlled by a clock signal (not shown).

The signal operational amplifier 18 has the inverting input thereto coupled to the summing node 16 via switch 17. The output of the amplifier 18 provides the analog output signal from the DAC 10. The non-inverting input of the amplifier 18 couples to the second voltage reference 12 for the proper bias voltages. A resistor 19, coupling between the output and the inverting input of the amplifier 18, forms the feedback path for the amplifier 18. Note that this arrangement provides for the inverting input of the amplifier 18 to be a virtual ground since the non-inverting input is at AC ground. Optional capacitor 20, disposed in parallel with resistor 19, adds a pole to the amplifier 18 to provide the low-pass filter characteristic thereto to remove undesired energy from the analog output signal, such as clock signal energy and aliased signals.

Figure 2:
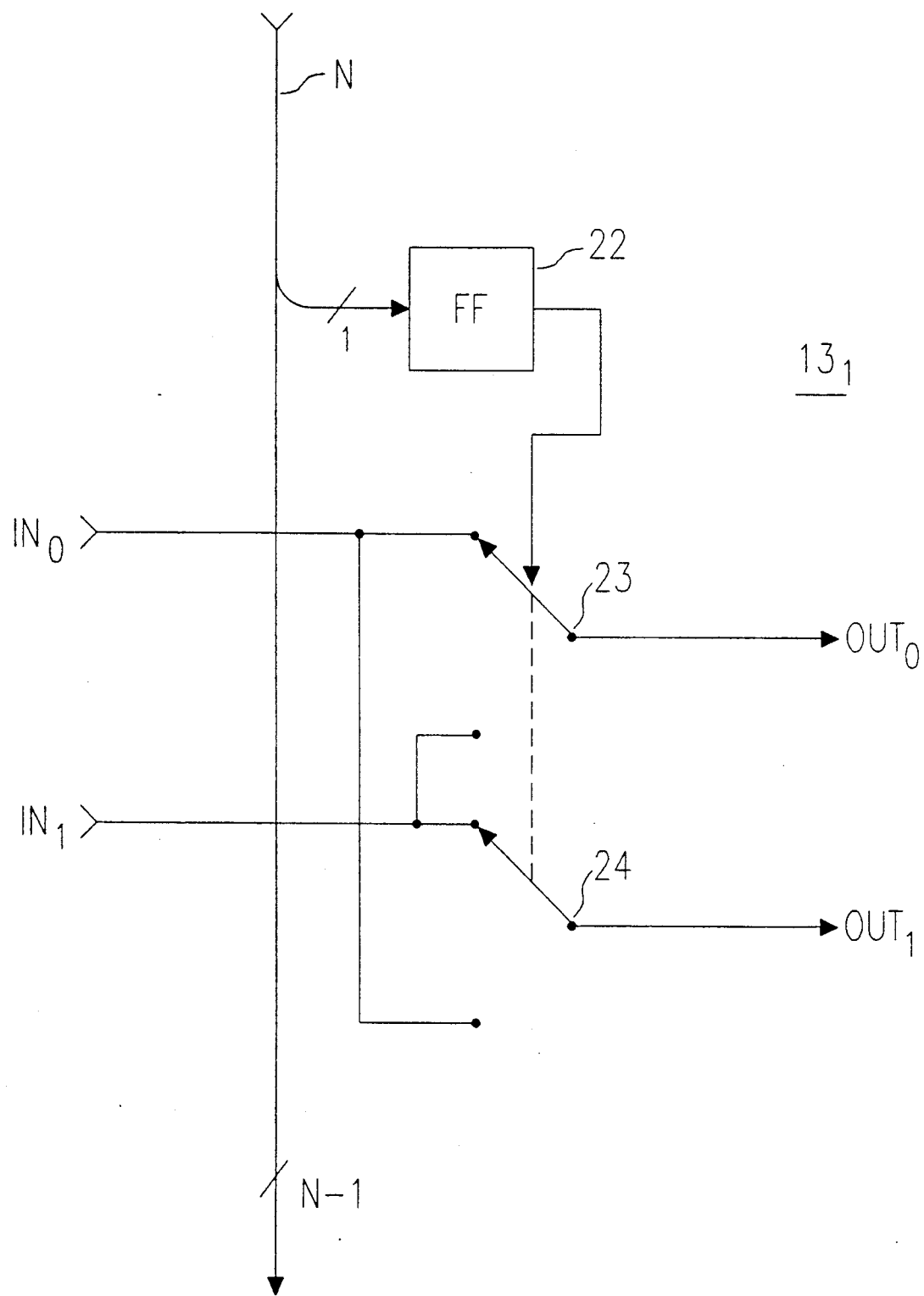
FIG. 2 is a diagram of an exemplary one of the 2×2 switches in FIG. 1.

Referring to FIG. 2, an exemplary 2×2 switch $13_1$ is shown. A flip-flop 22 stores the corresponding data bit from the digital input data (FIG. 1) and applies it to two exemplary 2:1 switches 23, 24. As shown, depending on the state of the flip-flop 22, the switches 23, 24 may pass signals on the inputs $In_0$, $In_1$ to outputs $Out_0$, $Out_1$ directly- or cross-coupled. It is noted that this embodiment is for illustrative purposes only; there are many configurations which will achieve the desired 2×2 switch function. As stated above, the flip-flop 22 may be loaded serially from a preceeding flip-flop 22 instead of in parallel, as shown.

The switched capacitor circuit 10 shown in FIG. 1 may be a multi-bit DAC (N>1) relying on the relative sizes (capacitances) of capacitors $15_1$-$15_N$ to weight the incoming digital data into the corresponding analog signal. The circuit 10 may be simplified to a one-bit DAC 10 (N=1) by utilizing only switches $13_1$, $14_1$, and signal capacitor $15_1$ along with summing node 16 and switch 17.

It is noted that the relative sizes of the capacitors $15_1$-$15_N$ determines the relative contribution (weight) of the corresponding bit of the digital input data to the output analog signal, not the overall, or absolute, magnitude of the analog output signal. The overall magnitude is determined, all reference voltages being invariant, by the total capacitance of the capacitors $15_1$-$15_N$ (i.e., the sum of the capacitances of capacitors $15_1$-$15_N$) in relation to the resistance of resistor 18, setting the overall conversion gain of the DAC 10. If the ratio of the total capacitance of the signal capacitors $15_1$–$15_N$ to the resistance of the resistor 18 changes due to fabrication tolerances (discussed above), then the digital input data to analog output signal conversion gain also changes. The resistance of the resistor 19 may be trimmed to compensate for this, but for each integrated circuit made, a different value resistor will be needed.

Therefore, to compensate for the variation in total capacitance of the signal capacitors $15_1$–$15_N$, the difference between the two voltage references 11, 12 is changed, increasing or decreasing the amount of charge that can the signal capacitors $15_1$–$15_N$ can utilize. This changes the overall conversion gain of the DAC 10. To accomplish this without having to trim the voltage references during manufacture, the reference 11 has a control operational amplifier 26 having the non-inverting input thereof coupling to the second reference 12 to make the output of the reference 11 dependent on the second reference 12. Further, a second resistor 30 and a switched capacitor 31, disposed in the feedback path of the amplifier 26, scales the voltage from the second reference 12 such that the output voltage from the reference 11 is approximately:

$$V_{12}(1 + 1/f_c R_{30} C_{31});$$

where $V_{12}$ is the voltage of the second voltage reference 12, $R_{30}$ is the resistance of resistor 30, $C_{31}$ is the capacitance of capacitor 31, and $f_c$ is the clock frequency of the clock signal (not shown) driving switches 27, 28. As stated above, the equivalent resistance of capacitor 31 is $1/f_c C_{31}$. Resistor 30 is used to initially set the output voltage of reference 11. It also allows for variations in the capacitance of capacitor 31 to vary the output voltage of the reference 11 to compensate for the total capacitance variations of capacitors $15_1$–$15_N$.

For example, the resulting overall conversion gain of a one-bit DAC 10 is approximately:

$$V_{12}(1 - dC_{15_1} R_{18}/R_{30} C_{31});$$

where $C_{15_1}$ and $C_{30}$ are the capacitances of capacitors $15_1$ and 30, respectively, $R_{18}$ is the resistance of resistor 18, and d is the average density of the single bit digital input signal (d ranging from minus one to plus one).

Capacitor 32 may be added to reference 11 to reduce any noise generated by the switching of capacitor 31 from entering the 2×2 switches $13_1$–$13_N$ and corrupting the digital-to-analog conversion process.

It is understood that the values of the capacitors $15_1$–$15_N$ may also be varied to produce a DAC which performs any desired conversion transformation, such as linear, µ-law or a-law conversion.

Having described the preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

We claim:

1. In an integrated circuit, a switched capacitor circuit having:
   at least one signal carrying operational amplifier having a first resistor in the feedback path thereof and an input;
   a first voltage reference; and,
   at least one signal capacitor, one end thereof selectively coupling between a second voltage reference and the input of the signal carrying operational amplifier, the other end thereof selectively coupling between the second voltage reference and the first voltage reference; characterized by:
   a second resistor;
   a switched compensation capacitor; and,
   means, responsive to the second resistor, switched capacitor and second voltage reference, for generating the first voltage reference;
   wherein the voltage of the first compensation voltage reference is dependent on the resistance of the second resistor and the equivalent resistance of the switched compensation capacitor; and
   wherein the switched compensation capacitor varies the voltage difference to compensate for variations in the capacitance of the signal capacitor.

2. The switched capacitor circuit recited in claim 1, wherein the means is characterized by:
   a control operational amplifier having inverting and non-inverting inputs and an output, the second resistor coupling between the inverting input and a first voltage source, the non-inverting input coupling to the second voltage reference, both ends of the switched compensation capacitor switching substantially simultaneously between coupling to the second voltage source and coupling to corresponding inverting input and output of the control operational amplifier in response to a clock signal;
   wherein the output of the control operational amplifier is the first voltage reference and the voltage thereon is substantially:

$$V_r(1 - 1/(f_c R_{30} C_{31})); \text{ and,}$$

wherein $V_r$ is the voltage of the second voltage reference, $f_c$ is the frequency of the clock signal, $R_{30}$ is the resistance of the second resistor, and $C_{31}$ is the capacitance of the switched compensation capacitor.

3. The switched compensation capacitor circuit recited in claim 2, wherein the control operational amplifier has a fixed capacitor coupling between the inverting input and the output thereof.

4. In an integrated circuit, a switched capacitor digital-to-analog converter, responsive to a digital input signal, having:
   a summing node;
   at least one signal carrying operational amplifier having a first resistor in the feedback path thereof and coupling to the summing node;
   a first voltage reference; and,
   at least one signal capacitor, a first end thereof selectively coupling between a second voltage reference and the summing node, the second end thereof selectively coupling between the second voltage reference and the first voltage reference in response to the digital input signal; characterized by:
   a second resistor;
   a switched compensation capacitor; and,
   means, responsive to the second resistor, switched capacitor and second voltage reference, for generating the first voltage reference;
   wherein the voltage of the first voltage is dependent on the second voltage reference, the resistance of the second resistor and the equivalent resistance of the switched compensation capacitor; and, wherein the second end of the signal capacitor is alternately coupling between the second voltage reference and the summing node in response to a clock signal having a frequency of $f_c$, and wherein the second end of the signal capacitor is selectively coupling between the second voltage reference and the first voltage reference in response to the clock signal in combination with the digital input signal.

5. The switched capacitor digital-to-analog converter recited in claim 4, wherein the means is characterized by:

a control operational amplifier having inverting and non-inverting inputs and an output, the second resistor coupling between the inverting input and a first voltage source, the non-inverting input coupling to the second voltage reference, both ends of the switched compensation capacitor switching substantially simultaneously between coupling to the second voltage source and coupling to corresponding inverting input and output of the control operational amplifier;

wherein the output of the control operational amplifier is the first voltage reference and the voltage thereon is substantially:

$$V_{12}(1-1/(f_c R_{30} C_{31}));$$

where $V_{12}$ is the voltage of the first voltage reference, $f_c$ is the clock frequency, $R_{30}$ is the resistance of the second resistor, and $C_{31}$ is the capacitance of the switched compensation capacitor.

6. The switched capacitor digital-to-analog converter recited in claim 5, wherein the control operational amplifier has a fixed capacitor coupling between the inverting input and the output thereof.

7. The switched capacitor digital-to-analog converter recited in claim 4, further comprising:

at least one $2 \times 2$ switch, corresponding to the signal capacitor, responsive to the digital input signal, and having two inputs and two outputs, the two inputs coupling to the corresponding first and second voltage references;

a switch, corresponding to the signal capacitor, responsive to the clock signal, and having two inputs and an output, the inputs coupling to the corresponding outputs of the $2 \times 2$ switch and the output coupling to the second end of the signal capacitor.

8. A method of compensating for variations in circuit characteristics of switched capacitor circuit formed in an integrated circuit, the circuit having:

at least one signal carrying operational amplifier having a first resistor in the feedback path thereof and an input;

a first voltage reference; and, at least one signal capacitor, one end thereof selectively coupling between a second voltage reference and the input of the signal carrying operational amplifier, the other end thereof selectively coupling between the second voltage reference and the first voltage reference; characterized by the step of:

varying the voltage of the first voltage reference in response to the second voltage reference, a second resistor, and the equivalent resistance of a compensation capacitor to compensate for variations in the capacitance of the signal capacitor;

wherein the voltage of the second voltage reference is substantially constant.

9. The method as recited in claim 8, the step of varying the voltage of the first voltage reference being characterized by the step of:

scaling the voltage from the second voltage reference with a control operational amplifier, having a inverting input and an output, as determined by the second resistor and the switched compensation capacitor, the switched compensation capacitor in the feedback path of the control operational amplifier; and, switching both ends of the switched compensation capacitor substantially simultaneously between coupling to the second voltage source and coupling to corresponding inverting input and output of the control operational amplifier in response to a clock signal;

wherein the output of the control operational amplifier is the first voltage reference and the voltage thereon is substantially:

$$V_{12}(1-1/(f_c R_{30} C_{31})); \text{ and}.$$

wherein $V_{12}$ is the voltage of the second voltage reference, $f_c$ is the frequency of the clock signal, $R_{30}$ is the resistance of the second resistor, and $C_{31}$ is the capacitance of the switched compensation capacitor.

* * * * *